United States Patent
Kaminaga (10) Patent No.: US 12,079,075 B2
(45) Date of Patent: *Sep. 3, 2024

(54) SEMICONDUCTOR STORAGE APPARATUS AND ECC RELATED INFORMATION READING METHOD

(71) Applicant: Winbond Electronics Corp., Taichung (TW)

(72) Inventor: Takehiro Kaminaga, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/238,158

(22) Filed: Apr. 22, 2021

(65) Prior Publication Data

US 2021/0357288 A1 Nov. 18, 2021

(30) Foreign Application Priority Data

May 13, 2020 (JP) .................. 2020-084259

(51) Int. Cl.
*G06F 11/00* (2006.01)
*G06F 11/10* (2006.01)
*G11C 16/04* (2006.01)
*G11C 16/26* (2006.01)

(52) U.S. Cl.
CPC ...... *G06F 11/1068* (2013.01); *G11C 16/0483* (2013.01); *G11C 16/26* (2013.01)

(58) Field of Classification Search
None
See application file for complete search history.

(56) References Cited

U.S. PATENT DOCUMENTS 8,560,925 B2  10/2013  Hughes et al.
10,957,384 B1 * 3/2021  Hung .................. G11C 29/789
(Continued)

FOREIGN PATENT DOCUMENTS

KR  20180030432  3/2018
KR  20190064100  6/2019
TW  I500039      9/2015

OTHER PUBLICATIONS

"Office Action of Korea Counterpart Application", issued on Sep. 29, 2022, with English translation thereof, pp. 1-5.

*Primary Examiner* — Mujtaba M Chaudry
(74) *Attorney, Agent, or Firm* — JCIPRNET (57) ABSTRACT

A semiconductor storage apparatus and an error checking and correction (ECC) related information reading method, which can output various information related to pages that have been error-corrected during a continuous reading operation, are provided. A NAND flash memory includes a memory cell array, a continuous reading component, an ECC related information memory part, and an output component. The continuous reading component continuously reads pages of the memory cell array. The ECC related information memory part stores page addresses of all of the pages that have been error-corrected by an ECC circuit regarding the pages continuously read by the continuous reading component. The output component outputs page addresses stored in the ECC related information memory part in response to a read command after the continuous reading operation.

20 Claims, 8 Drawing Sheets

(56) References Cited

U.S. PATENT DOCUMENTS

| | | | |
|---|---|---|---|
| 2013/0275843 A1* | 10/2013 | Narayanan | G06F 11/1004 |
| | | | 714/799 |
| 2014/0269065 A1* | 9/2014 | Jigour | G11C 29/04 |
| | | | 365/185.17 |
| 2016/0034346 A1* | 2/2016 | Michael | H03M 13/13 |
| | | | 714/755 |
| 2016/0034351 A1* | 2/2016 | Michael | G06F 11/1048 |
| | | | 714/758 |
| 2017/0255385 A1* | 9/2017 | Tokiwa | G11C 16/0483 |
| 2017/0262339 A1* | 9/2017 | Hoshina | B60K 35/00 |
| 2017/0329667 A1 | 11/2017 | Hirano et al. | |
| 2019/0252035 A1* | 8/2019 | Lin | G11C 29/42 |
| 2019/0371220 A1* | 12/2019 | Zhou | G11C 29/14 |
| 2021/0011801 A1* | 1/2021 | Liikanen | G06F 11/1048 |
| 2021/0365375 A1* | 11/2021 | Mondello | G11C 29/886 |
| 2022/0027089 A1* | 1/2022 | Zeng | G11C 16/26 |

\* cited by examiner

| Page 0 |
|---|
| Page 1 |
| Page 2 |
| Page 3 |
| Page 4 |
| Page 5 |
| Page 6 |
| Page 7 |
| Page 8 |
| Page 9 |
| Page 10 |

...

| Page 53 |
|---|
| Page 54 |
| Page 55 |
| Page 56 |
| Page 57 |
| Page 58 |
| Page 59 |
| Page 60 |
| Page 61 |
| Page 62 |
| Page 63 |

FIG. 9(A)

ECC related information

| Number of pages | 001000 |
|---|---|
| First page | 000011 |
| Last page | 111101 |

FIG. 9(B)

SEMICONDUCTOR STORAGE APPARATUS AND ECC RELATED INFORMATION READING METHOD

CROSS-REFERENCE TO RELATED APPLICATION

This application claims the priority benefit of Japan application serial no. 2020-084259, filed on May 13, 2020. The entirety of the above-mentioned patent application is hereby incorporated by reference herein and made a part of this specification.

BACKGROUND

Technical Field

The disclosure relates to a NAND flash memory, and particularly relates to the output of information related to pages that have been error-corrected during a continuous reading operation.

Description of Related Art

In order to implement compatibility with a NOR serial flash memory, a serial interface is sometimes equipped in the NAND flash memory to enable continuous readout of pages. In addition, in order to ensure the correctness of the continuous readout, a flash memory that may perform error checking and correction (ECC) processing using an ECC circuit during a continuous reading operation is also required.

Figure 1:
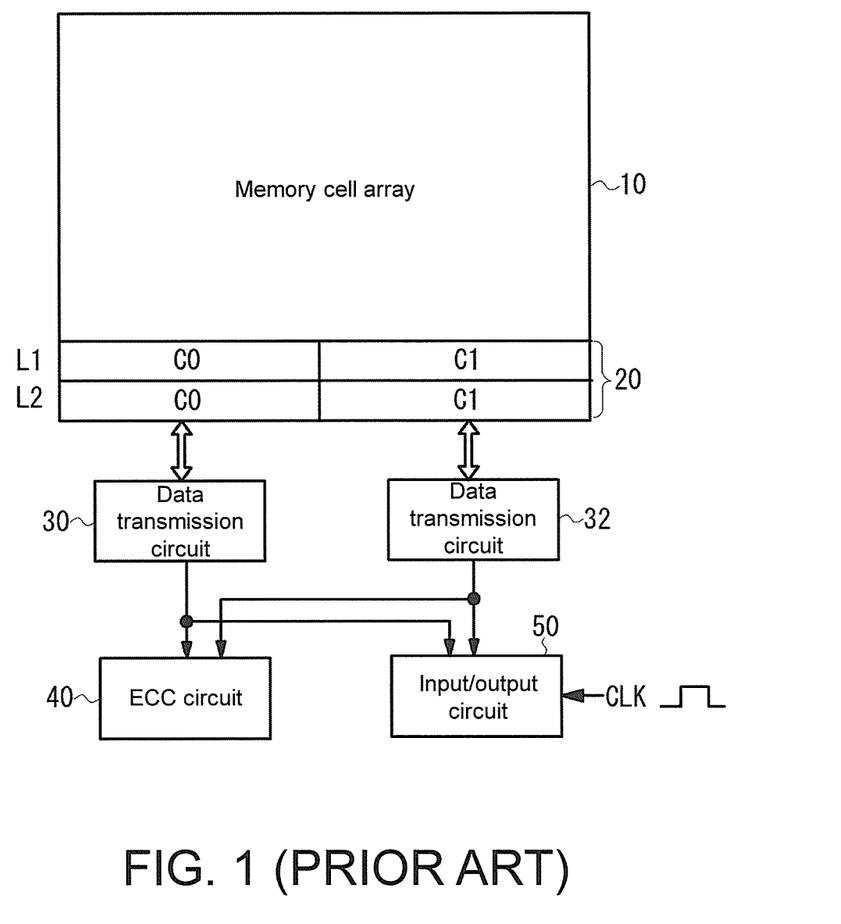
FIG. 1 is a diagram of a continuous reading operation of a conventional NAND flash memory equipped with an on-chip error checking and correction (ECC) function.

FIG. 1 shows a schematic configuration of a NAND flash memory equipped with an on-chip ECC function. The flash memory includes a memory cell array 10 containing a NAND string, a page buffer/readout circuit 20, a data transmission circuit 30, a data transmission circuit 32, an ECC circuit 40, and an input/output circuit 50. The page buffer/readout circuit 20 includes two latches L1 and L2 (each latch is, for example, 2 KB) that hold read data or data to be programmed. The latches L1 and latches L2 respectively include a first cache C0 and a second cache C1 (each cache is, for example, 1 KB).

In the case of continuous readout in the NAND flash memory equipped with a serial peripheral interface (SPI) function, a host apparatus inputs an 8-bit page data read command (for example, "13h") and a 16-bit page address PA in synchronization with a clock signal. As a result, the flash memory becomes a continuous reading mode, the page address PA is automatically incremented, pages are continuously read from the memory cell array 10, and the read data is output to the outside in synchronization with a clock signal CLK. The continuous readout is ended by, for example, a command to end readout or triggering of a chip selection signal.

The size of data read once through the continuous reading operation is, for example, determined by the size of a cache register on the host apparatus side. That is, when the cache register is fully occupied by the data from the flash memory, the host apparatus stops the continuous readout, and processes the data held in the cache register during such period. After the data processing ends, the host apparatus accesses the flash memory again and outputs a continuous read command.

During the continuous readout, the page data read from the memory cell array 10 is transmitted to the latch L1, and the data held in the latch L1 is transmitted to the latch L2 in units of ½ page (the first cache C0 or the second cache C1). On the other hand, during the period of outputting the data held in the first cache C0 of the latch L2, the data held in the second cache C1 is processed by the ECC circuit 40. During the period of outputting the data held in the second cache C1, the data held in the first cache C0 is processed by the ECC circuit 40. The data held in the first cache C0 or the second cache C1 of the latch L2 is output from the input/output circuit 50 in synchronization with the external clock signal CLK.

In order to evaluate the reliability, etc. of the data read through the continuous reading operation, the host apparatus can issue a read command to the flash memory. The read command reads information related the pages that have been error-corrected during the continuous reading operation. The read command is, for example, a "last ECC failure page address command (for example, "A9h")". After the host apparatus issues the read command of "A9h" after the continuous reading operation, the page address of the page that has been error-corrected last during the continuous reading operation may be obtained from the flash memory. That is, after the flash memory receives the read command of "A9h", even if there are other pages that have been error-corrected in the continuous pages, the information will not be output.

Figure 2:
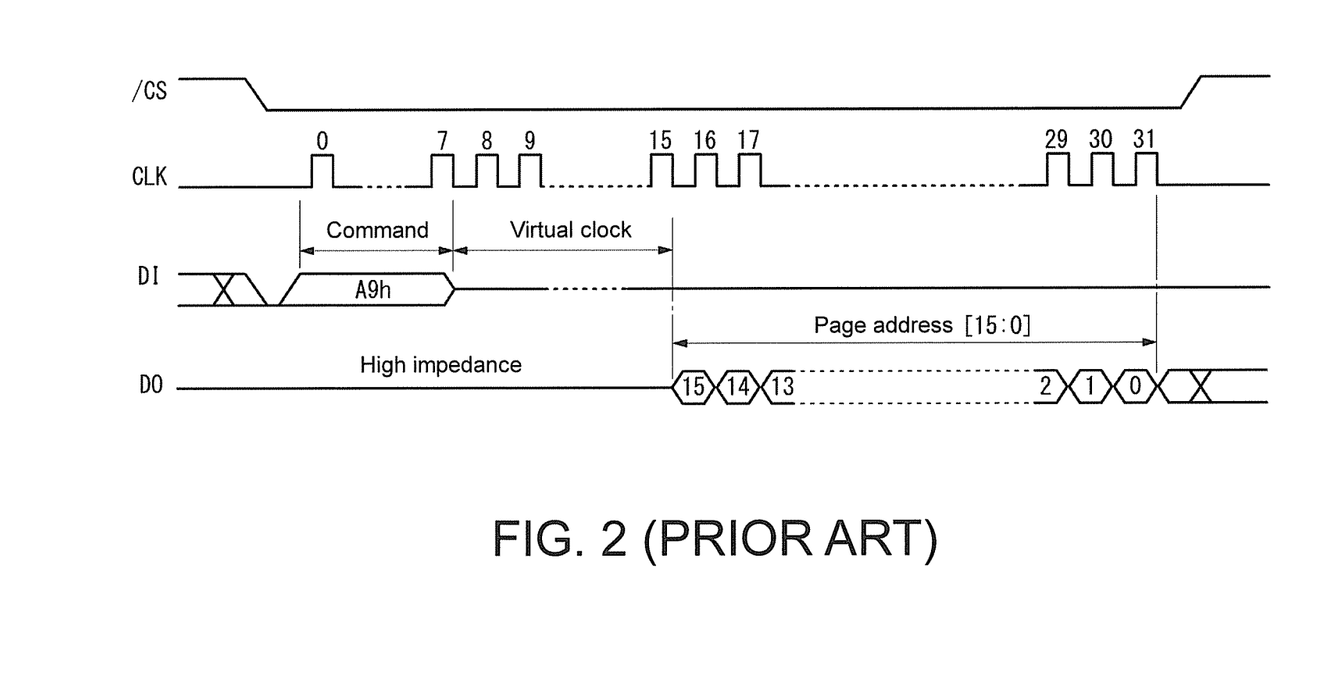
FIG. 2 is an operation timing diagram of a conventional command for reading a page address of a page that has been error-corrected last.

FIG. 2 shows an operation timing diagram of the read command of "A9h". The host apparatus enables a chip selection signal /CS to become low level and selects the flash memory. Next, when the 8-bit read command of "A9h" is input from the host apparatus to the flash memory in synchronization with the clock signal CLK, the flash memory outputs the 16-bit page address of the page that has been error-corrected last to the host apparatus in synchronization with the clock signal CLK.

Figure 3:
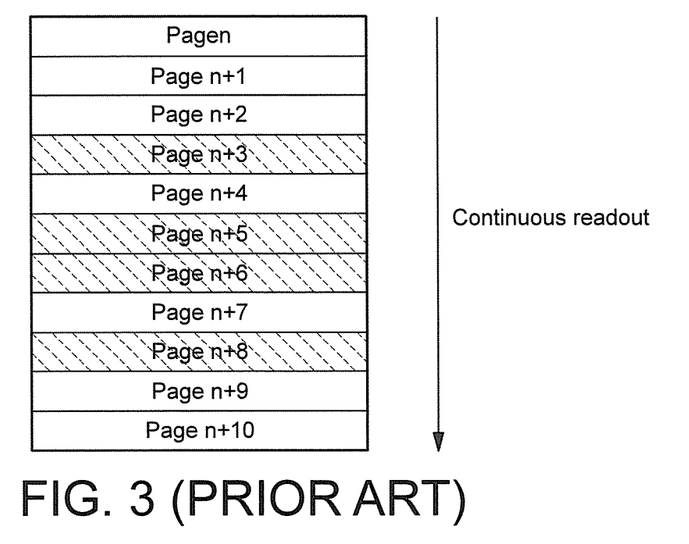
FIG. 3 is a diagram of an example of a continuous reading operation.

FIG. 3 shows an example of continuous readout from a page n to a page n+10, and a page n+3, a page n+5, a page n+6, and a page n+8 have been error-corrected. After the flash memory receives the read command of "A9h", the page address of the page n+8 that has been error-corrected last during the continuous reading operation is output to the host apparatus, but the page addresses of the other page n+3, page n+5, and page n+6 that have been error-corrected are not output. Regarding the host apparatus, in the continuously read pages, sometimes only the information of the pages that have been error-corrected last is passed, so the reliability, etc. of the continuously read data cannot be adequately evaluated. For example, when performing continuous readout that spans multiple blocks, it is impossible to know which block is being error-corrected, what is the frequency or ratio of pages that have been error-corrected, etc.

On the other hand, in the flash memory, there is a flash memory corresponding to ECC status reading in which an ECC status is read in units of pages. For example, in the case of the continuous reading operation as shown in FIG. 3, if the ECC status is not read in units of pages from the page n to the page n+10, the error-correction of the page n+3, the page n+5, and the page n+6 cannot be confirmed. Executing such processing will forcibly impose a large load on the host apparatus.

SUMMARY

The disclosure provides a semiconductor storage apparatus, which can output various information related to pages that have been error-corrected during a continuous reading operation.

The semiconductor storage apparatus of the disclosure includes a NAND memory cell array; a continuous reading component, continuously reading pages of the memory cell array; a memory component, storing error checking and correction (ECC) related information related to pages that have been error-corrected by an ECC circuit regarding the pages continuously read by the continuous reading component; and an output component, outputting the ECC related information stored in the memory component in response to a read command after the continuous reading operation.

The ECC related information reading method of a NAND flash memory of the disclosure includes the following steps. A reading step of continuously reading pages of a memory cell array. A storing step of storing ECC related information related to pages that have been error-corrected by an ECC circuit regarding the continuously read pages. An outputting step of outputting the ECC related information in response to a read command after the continuous reading operation. The ECC related information includes at least one of page addresses of all of the pages that have been error-corrected, the number of pages that have been error-corrected, and a page address of a first page and a page address of a last page that have been error-corrected.

According to the disclosure, the ECC related information related to the pages that have been error-corrected by the ECC circuit during the continuous reading operation is stored, and the stored ECC related information is output in response to the command after the continuous reading operation. Therefore, various information related to the pages that have been error-corrected can be provided to a host apparatus, etc.

DETAILED DESCRIPTION OF DISCLOSED EMBODIMENTS

Next, embodiments of the disclosure will be described. A semiconductor storage apparatus of the disclosure is, for example, a NAND flash memory or a microprocessor, a microcontroller, a logic, an application specific integrated circuits (ASIC), a processor for processing an image or a sound, a processor for processing a signal such as a wireless signal, etc. embedded with such flash memory. In an embodiment, in order to implement compatibility with a NOR flash memory, the NAND flash memory is equipped with a serial peripheral interface (SPI), thereby enabling continuous readout of multiple pages in synchronization with an external clock signal.

In some embodiments, a host apparatus is connected to the flash memory via the SPI. The host apparatus is, for example, a processor, a controller, a computer, etc., which outputs various commands (reading, programming, erasing, etc.) to the flash memory, and receives data output from the flash memory.

Figure 4:
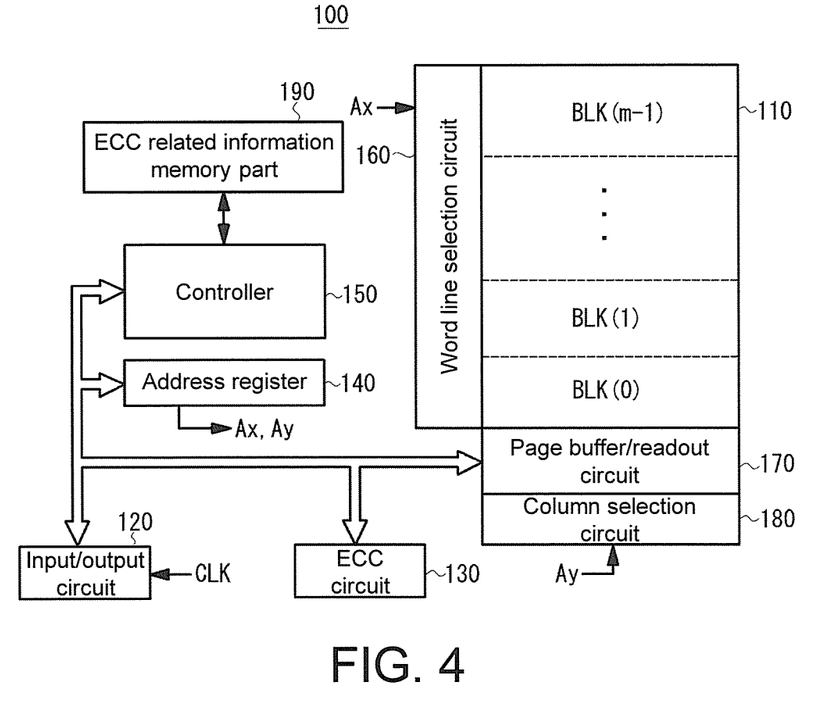
FIG. 4 is a block diagram of a structure of a NAND flash memory according to the disclosure.

Next, embodiments of the disclosure will be described in detail with reference to the drawings. FIG. 4 is a diagram of an internal structure of a NAND flash memory according to an embodiment of the disclosure. A flash memory 100 includes a memory cell array 110, arranged with multiple memory cells in a matrix form; an input/output circuit 120, connected to an external input/output terminal and outputting data to the outside or inputting data received from the outside in response to a clock signal CLK from the outside; an ECC circuit 130, generating an error-correction code of data to be programmed or performing ECC on read data; an address register 140, receiving address data via the input/output circuit 120; a controller 150, controlling each part based on a command received via the input/output circuit 120 or a control signal applied to a control terminal; a word line selection circuit 160, selecting a block, a word line, etc. based on a decoding result of row address information Ax from the address register 140; a page buffer/readout circuit 170, holding data read from a selected page of the memory cell array 110 or holding the data to be programmed to the selected page; a column selection circuit 180, selecting a column, etc. based on a decoding result of column address information Ay from the address register 140; and an ECC related information memory part 190, storing ECC related information related to pages that have been error-corrected by the ECC circuit 130 during a continuous reading operation. Furthermore, although not shown in the drawing, the flash memory 100 includes an internal voltage generating circuit that generates voltages (a programming voltage Vpgm, a pass voltage Vpass, a read voltage Vread, an erase voltage Vers, etc.) required for reading, programming (writing), erasing, etc. of data.

The memory cell array 110 has, for example, m blocks BLK(0), BLK(1), . . . , and BLK(m−1) disposed along a column direction. Multiple NAND strings are formed in a block, and one NAND string includes multiple memory cells connected in series, a bit line side selection transistor, and a source line side selection transistor. A drain of the bit line side selection transistor is connected to a corresponding bit line, and a source of the source line side selection transistor is connected to a common source line. A gate of the memory cell is connected to a corresponding word line, and gates of the bit line side selection transistor and the source line side selection transistor are respectively connected to a select gate line SGD and a select gate line SGS. Based on the row address information Ax, the word line selection circuit 160 drives the bit line side selection transistor and the source line side selection transistor via the select gate line SGD and the select gate line SGS to select a block or a word line. The NAND string may be two-dimensionally formed on a substrate surface or three-dimensionally formed on the substrate surface. In addition, the memory cell may be either a single level cell (SLC) type that stores one bit or a multi-level cell (MLC) type that stores multiple bits.

During a reading operation of the flash memory 100, a certain positive voltage is applied to a bit line, a certain voltage (for example, 0 V) is applied to a selected word line, the pass voltage Vpass (for example, 4.5 V) is applied to a non-selected word line, and a positive voltage (for example, 4.5 V) is applied to the select gate line SGD and the select gate line SGS, so that the bit line side selection transistor and the source line side selection transistor are turned on, and a common source line SL becomes 0 V. During a programming operation, the high-voltage programming voltage Vpgm (for example, 15 V to 20 V) is applied to the selected word line, and a midpoint potential (for example, 10 V) is applied to the non-selected word line, so that the bit line side selection transistor is turned on and the source line side selection transistor is turned off, and a potential corresponding to data "0" or "1" is supplied to the bit line. During an erasing operation, 0 V is applied to the selected word line in a block, and a high voltage (for example, 20 V) is applied to a p-well.

As shown in FIG. 1, the page buffer/readout circuit 170 includes two latches L1 and L2. The two latches L1 and L2 hold data read from the memory cell array 110 or hold data to be programmed to the memory cell array 110. The latch L1 and the latch L2 respectively hold one page of data (for example, 2 KB). The latch L1 and the latch L2 respectively include a first cache C0 and a second cache C1 (each cache, is for example, 1 KB). Two-way data transmission between the latch L1 and the latch L2 is independently performed in units of cache. During the continuous reading operation, the latch L1 and the latch L2 can perform two-stage pipeline processing. During the period of outputting data held by the latch L2 to the outside in synchronization with the clock signal CLK, data of the next page selected in the memory cell array 110 is transmitted to the latch L1. In addition, before outputting the data held in the latch L2 to the outside, the ECC circuit 130 is used for ECC.

During the programming operation, the data input from the input/output circuit 120 is loaded to the latch L2 of the page buffer/readout circuit 170. Then, the data held in the latch L2 is transmitted to the ECC circuit 130. The ECC circuit 130 performs an ECC computation on the transmitted data, generates an error-correction code, and writes the generated error-correction code back to the spare region of the page buffer/readout circuit 170. Then, the input data and the error-correction code are programmed to the selected page of the memory cell array 110.

During the reading operation, the data read from the selected page of the memory cell array 110 is transmitted to the latch L1 of the page buffer/readout circuit 170. Then, the data held in the latch L1 is transmitted to the latch L2, and the data held in the latch L2 is transmitted to the ECC circuit 130. The ECC circuit 130 checks whether there is any error based on the error-correction code, and corrects an error in the data of the latch L2 when the error is detected. The correction is performed by, for example, writing the data back to the latch L2. Then, the data held in the latch L2 is output to the outside via the input/output circuit 120.

Figure 5:
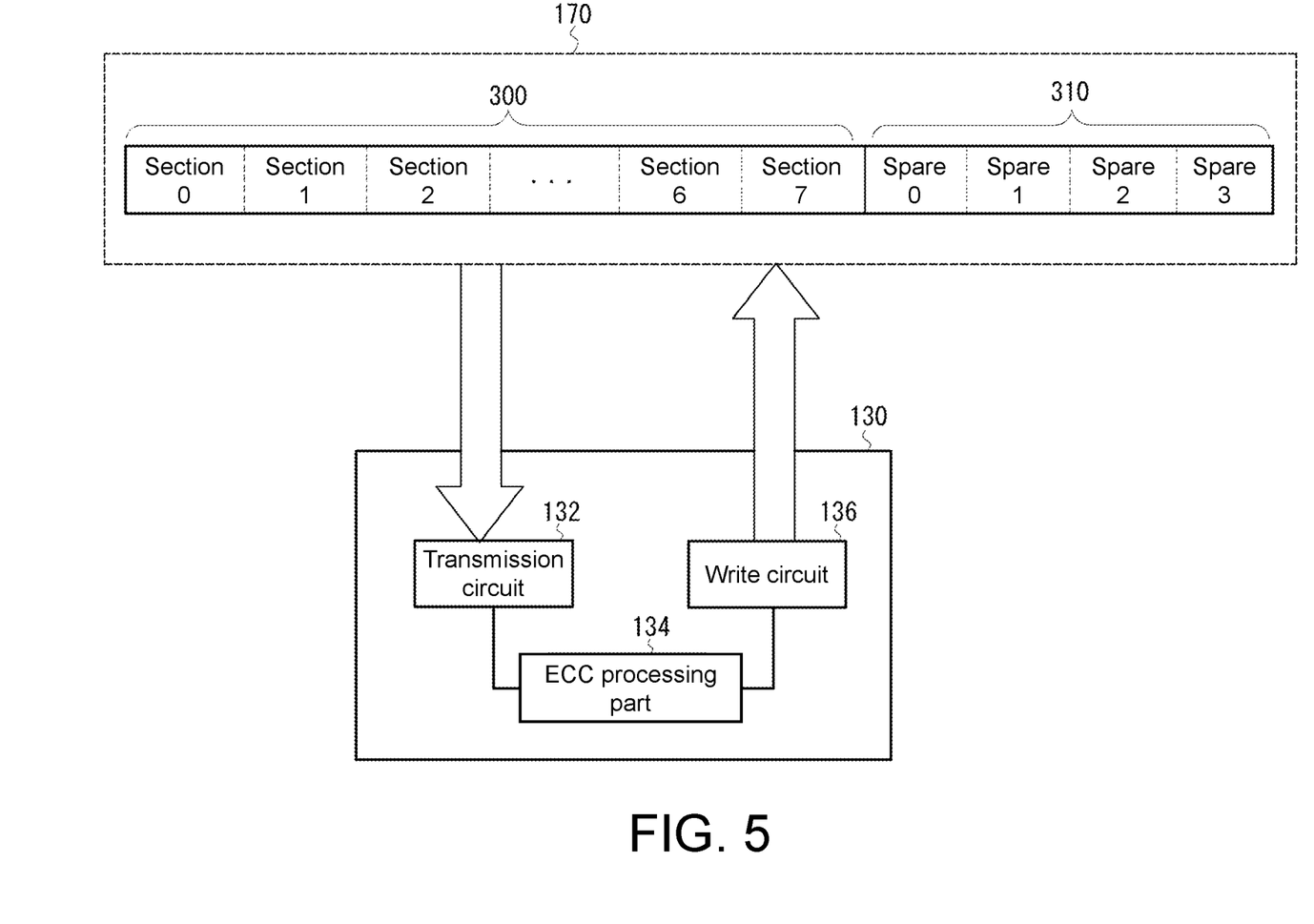
FIG. 5 is a diagram of an example of a regular region and a spare region of a page of a memory cell array.

FIG. 5 shows a data structure of the page buffer/readout circuit 170. The page buffer/readout circuit 170 includes a regular region 300, divided into eight sections, a section 0 to a section 7, and a spare region 310, divided into four sections, a spare 0, a spare 1, a spare 2, and a spare 3. For example, one section of the regular region 300 contains 256 bytes, and the eight sections of the regular region 300 hold approximately 2 K bytes of data in overall.

For example, one section of the spare region 310 contains 16 bytes, and the four sections (the spare 0 to the spare 3) hold 64 bytes of data in overall. Error-correction codes of the section 0 and the section 1 of the regular region 300 are stored in the spare 0, error-correction codes of the section 2 and the section 3 of the regular region 300 are stored in the spare 1, error-correction codes of the section 4 and the section 5 of the regular region 300 are stored in the spare 2, and error-correction codes of the section 6 and the section 7 of the regular region 300 are stored in the spare 3.

The ECC circuit 130 includes a transmission circuit 132, receiving data transmitted in units of sections; an ECC processing part 134, generating an error-correction code through performing the ECC computation or checking an error based on the error-correction code; and a write circuit 136, configured to write the error-correction code to the spare region 310 or correct data of the regular region 300 when an error is detected.

During the continuous reading operation, the controller 150 monitors pages that have been error-corrected by the ECC circuit 130, and stores ECC related information related to the pages that have been error-corrected in the ECC related information memory part 190. The ECC related information memory part 190 is a storage region prepared separately from the memory cell array 110 and includes a random access memory (RAM) region that can be read and written (for example, a static RAM (SRAM), a register, etc.). The ECC related information includes, for example, a page address of a page that has been error-corrected, the number of pages that have been error-corrected, page addresses of a first page and a last page that have been error-corrected, etc. After the continuous reading operation, the controller 150 receives a read command of the ECC related information, reads the ECC related information stored in the ECC related information memory part 190, and outputs the ECC related information to the host apparatus. The ECC related information memory part 190 holds, for example, the ECC related information until the next continuous readout or the next page readout, and updates the ECC related information in the case of the next continuous readout.

Figure 6A:
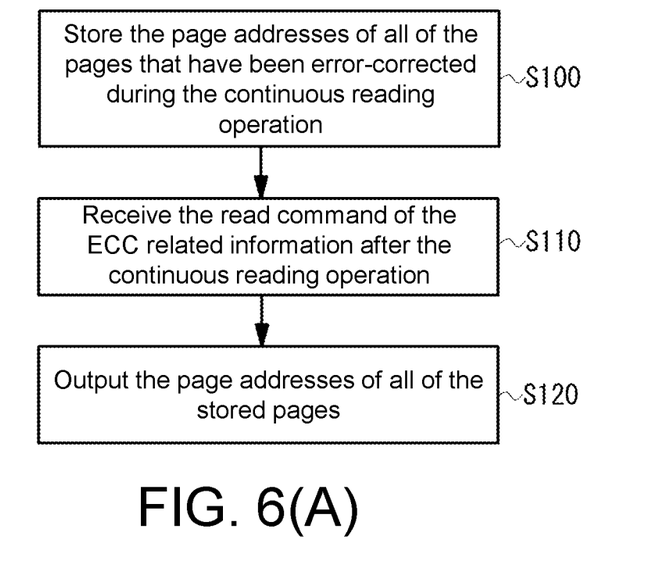
FIG. 6(A) and FIG. 6(B) show a flowchart of a reading operation of ECC related information according to a first embodiment of the disclosure.

Next, the reading operation of the ECC related information according to a first embodiment of the disclosure will be described. FIG. 6(A) is a flowchart of the reading operation of the ECC related information according to the first embodiment. During the continuous reading operation, the controller 150 monitors the pages that have been error-corrected by the ECC circuit 130, and stores the page addresses of all of the pages that have been error-corrected in the ECC related information memory part 190 (S100).

The controller 150 transitions to a continuous reading mode in response to a continuous read command, and starts continuous readout from the input page address. The page address of the first page is set in a row address counter. After the reading of the first page ends, the row address counter is automatically incremented and the next page is read. During the continuous reading operation, the continuous readout is continued without inputting the read command or the page address.

During the continuous reading operation, the ECC is performed on pages held in the latch L2 using the ECC circuit 130. After performing error-correction through the ECC circuit 130, the controller 150 stores the page address (for example, the page address held in the row address counter) of the page in the ECC related information memory part 190. The continuous reading operation is ended by, for example, a command to end readout or triggering of a chip selection signal. Alternatively, the continuous readout may also be set to end when the row address counter is consistent with a specified address.

After the continuous reading operation ends, after receiving the command of the reading operation of the ECC related information from the host apparatus (S110), the controller 150 reads the page addresses of all of the pages stored that have been error-corrected stored in the ECC related information memory part 190, and outputs the page addresses (S120).

Figure 6B:
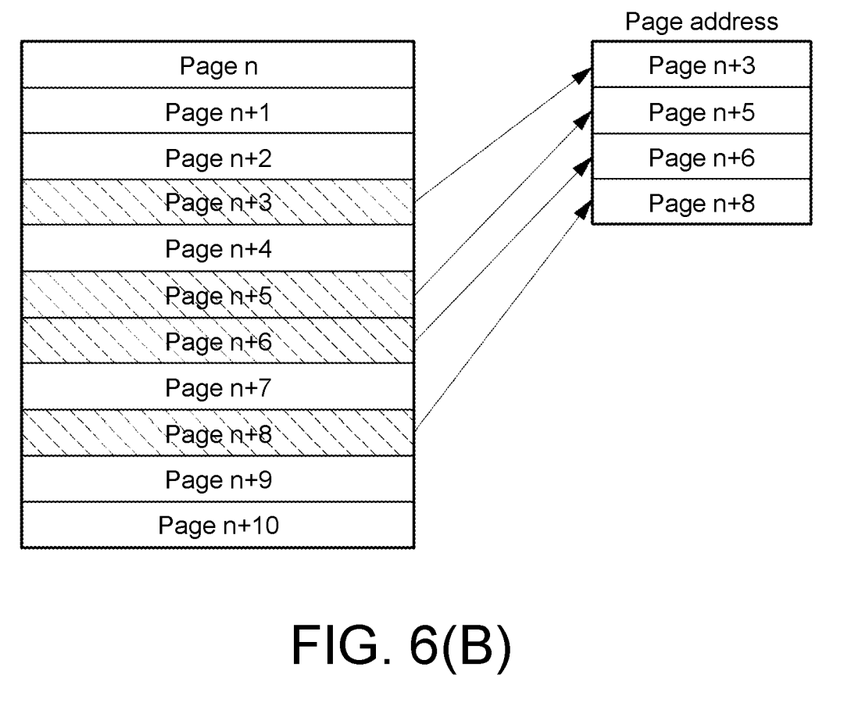

FIG. 6(B) shows the pages that have been performed with the continuous reading operation. In the drawing, the shaded lines show the pages that have been error-corrected. During the continuous reading operation, the controller 150 writes page addresses of a page n+3, a page n+5, a page n+6, and a page n+8 to the ECC related information memory part 190. Then, when receiving the read command of the ECC related information, all the page addresses stored in the ECC related information memory part 190 are read and output to the host apparatus.

According to the embodiment, the host apparatus may receive all the page addresses that have been error-corrected during the continuous reading operation, thereby analyzing or evaluating the reliability of the continuously read data. In the embodiment, the size of the ECC related information memory part 190 requires a capacity that may be used to store page addresses of all pages. In order to suppress storage capacity, the application is preferably continuous readout of pages in one block. For example, if one block has 64 pages, the ECC related information memory part 190 has a capacity for storing page addresses of the 64 pages.

In order to reduce the storage capacity of the ECC related information memory part 190, a block address portion is further preferably omitted from the page addresses stored in the ECC related information memory part 190. The host apparatus knows the block address of the page to be read continuously, so the block address is not necessarily necessary for the host apparatus. As shown in FIG. 2, the page address is 16 bits, and the page address with the block address deleted is 6 bits.

For example, when one block is set to 64 pages, the storage capacity of 16 bits×64 pages=1024 bits may be reduced to the storage capacity of 6 bits×64 pages=384 bits. However, in the case where the storage capacity of the ECC related information memory part 190 may be sufficiently ensured, the page address may also be set to include the block address, so that the page address may also be set to store the page addresses of multiple blocks during the continuous reading operation that spans multiple blocks.

Figure 7A:
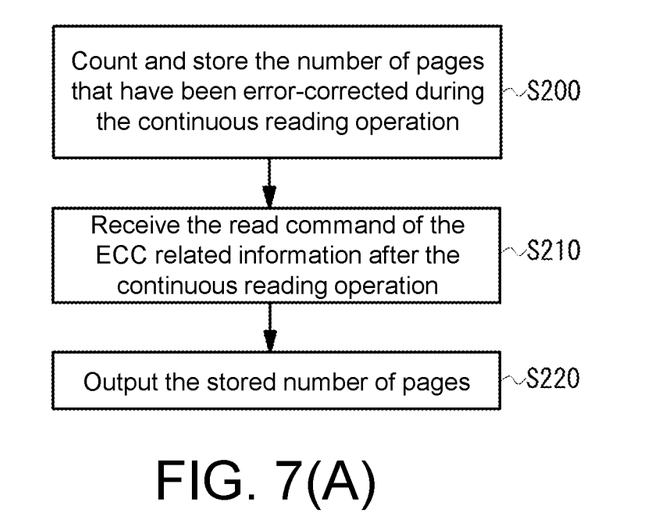
FIG. 7(A) and FIG. 7(B) show a flowchart of a reading operation of ECC related information according to a second embodiment of the disclosure.

Next, the reading operation of the ECC related information based on a second embodiment will be described with reference to the flowchart of FIG. 7(A) and FIG. 7(B). During the continuous reading operation, the controller 150 monitors the error-correction using the ECC circuit 130, and counts the pages that have been error-corrected using the ECC circuit 130. Finally, the number of pages that have been error-corrected during the continuous reading operation is stored in the ECC related information memory part 190 (S200). After the continuous reading operation ends, after receiving the command of the reading operation of the ECC related information from the host apparatus (S210), the controller 150 reads and outputs the number of pages that have been error-corrected stored in the ECC related information memory part 190 (S220).

Figure 7B:
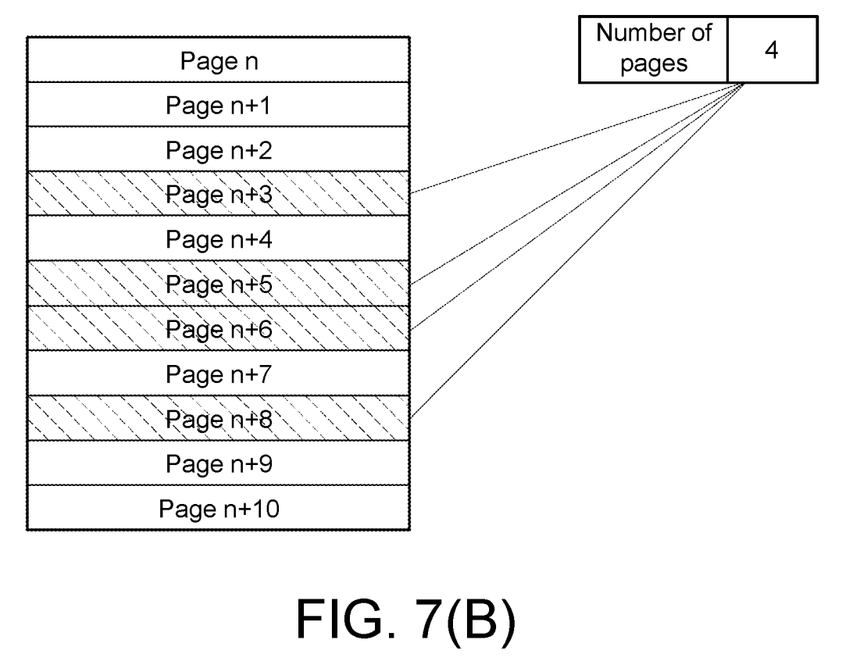

FIG. 7(B) shows the pages that have been performed with the continuous reading operation. In the drawing, the shaded lines show the pages that have been error-corrected. During the continuous reading operation, the controller 150 increments the counter when the page n+3, the page n+5, the page n+6, and the page n+8 are respectively error-corrected. Finally, the page number "4" (calculated as "100" in binary data) is stored in the ECC related information memory part 190. Then, when receiving the read command of the ECC related information, the number of pages stored in the ECC related information memory part 190 is read and output to the host apparatus.

According to the embodiment, the host apparatus may receive the number of pages that have been error-corrected during the continuous reading operation, thereby knowing the degree of error-correction performed during the continuous reading operation. For example, the host apparatus may analyze or evaluate the reliability, etc. of the continuously read data according to all the continuously read pages or the ratio of the pages that have been error-corrected to all the blocks.

In the case of the embodiment, the continuously read pages may span multiple blocks. In addition, in the embodiment, instead of storing the page address as in the first embodiment, the number of pages is stored, so that the storage capacity of the ECC related information memory part 190 may be further reduced.

Figure 8A:
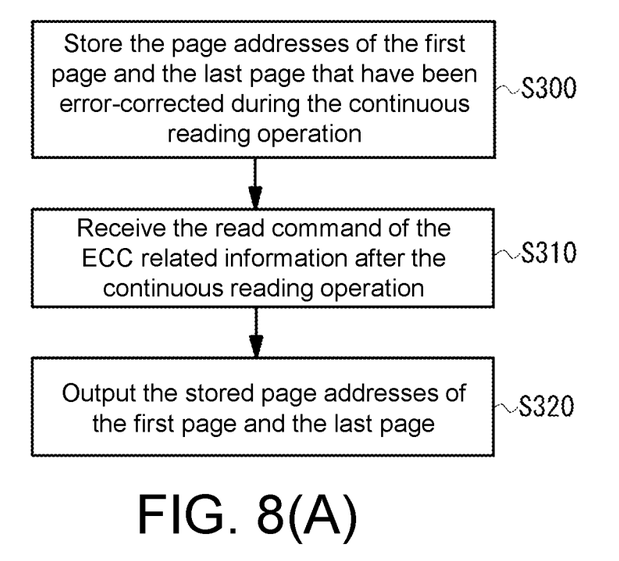
FIG. 8(A) and FIG. 8(B) show a flowchart of a reading operation of ECC related information according to a third embodiment of the disclosure.

Next, the reading operation of the ECC related information based on the third embodiment will be described with reference to the flowchart of FIG. 8(A) and FIG. 8(B). During the continuous reading operation, the controller 150 monitors the error-correction using the ECC circuit 130, and stores the page addresses of the first page and the last page that have been error-corrected using the ECC circuit 130 in the ECC related information memory part 190 (S300). After the continuous reading operation ends, after receiving the command of the reading operation of the ECC related information from the host apparatus (S310), the controller 150 reads and outputs the page addresses of the first page and the last page that have been error-corrected stored in the ECC related information memory part 190 (S320).

Figure 8B:
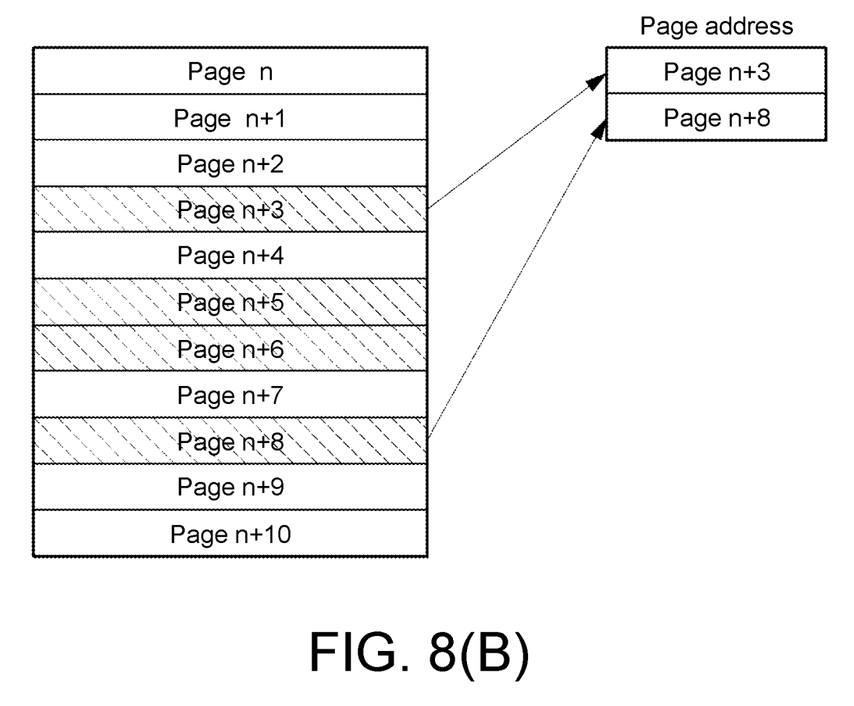

FIG. 8(B) shows the pages that have been performed with the continuous reading operation. In the drawing, the shaded lines show the pages that have been error-corrected. During the continuous reading operation, the controller 150 writes the page addresses of the first page n+3 and the last page n+8 that have been error-corrected to the ECC related information memory part 190. Then, when receiving the read command of the ECC related information, each of the page addresses of the first page n+3 and the last page n+8 stored in the ECC related information memory part 190 are read, and output to the host apparatus.

According to the embodiment, the host apparatus may receive the page addresses of the first page and the last page that have been error-corrected, thereby analyzing or evaluating the reliability, etc. of the read data output during the continuous reading operation according to the interval between the first page and the last page, the blocks that the first page and the last page belong to, etc.

In the case of the embodiment, the storage capacity of the ECC related information memory part 190 is 32 bits of the page addresses of 2 pages. In addition, in the case of the embodiment, the continuous readout may be in units of blocks or span multiple blocks.

Next, the reading operation of the ECC related information based on a fourth embodiment will be described. The fourth embodiment is formed by arbitrarily combining the first embodiment to the third embodiment. The combinations are, for example, the first embodiment and the second embodiment, the first embodiment and the third embodiment, the second embodiment and the third embodiment, and the first embodiment, the second embodiment, and the third embodiment.

For example, in the case of combining the second embodiment and the third embodiment, the number of pages that have been error-corrected and the page addresses of the first page and the last page that have been error-corrected are stored, and the information is output to the host apparatus in response to the read command. The host apparatus may know the number of pages that have been error-corrected between the first page and the last page, so as to analyze or evaluate the reliability, etc. of the read data.

For example, if one block is 64 pages. In the case where the continuous readout is executed in one block, a total of 18 bits (with the block address omitted) of the ECC related information of 6 bits required for the 64 pages, 6 bits for the page address of the first page, and 6 bits for the page address of the last page is output to the host apparatus.

Figure 9A:
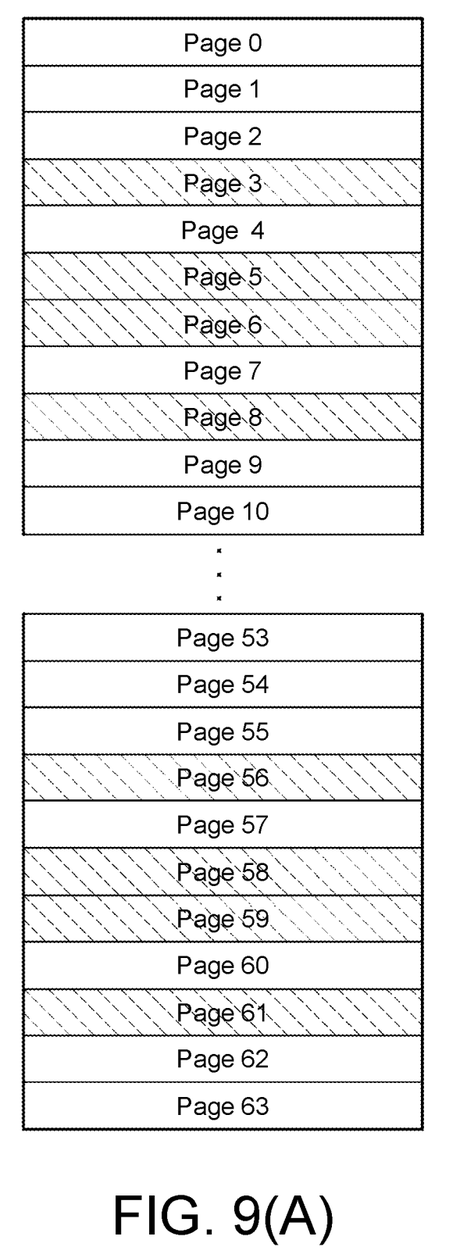
FIG. 9(A) and FIG. 9(B) show a flowchart of a reading operation of ECC related information according to a fourth embodiment of the disclosure.
Figure 9B:
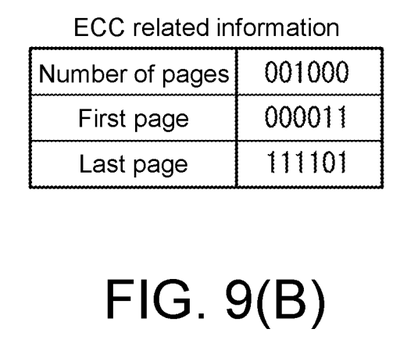

FIG. 9(A) shows the continuously read pages in one block. In the drawing, the shaded lines show a page 3, a page 5, a page 6, a page 8, a page 56, a page 58, a page 59, and a page 61 that have been error-corrected. In this case, as shown in FIG. 9(B), data of 6 bits for counting the number of pages that have been error-corrected (in the embodiment, the number of pages that have been error-corrected is 8 pages, so the 6 bits are "001000"), 6 bits "000011" as the page address of the first page 3 that has been error-corrected, and 6 bits "111101" as the page address of the last page 61 that has been error-corrected is stored in the ECC related information memory part 190. The controller 150 outputs the 18 bits of the data stored in the ECC related information memory part 190 to the host apparatus in response to the read command of the ECC related information from the host apparatus.

In addition, in the case where the continuous reading operation spans blocks, if the number of blocks is 1024, a total of 48 bits of 16 bits required for counting 1024×64 pages, 16 bits as the page address of the first page that has been error-corrected, and 16 bits as the page address of the last page that has been error-corrected is stored in the ECC related information memory part 190, and the information is provided to the host apparatus in response to the read command.

In this way, the host apparatus may take the next action by determining the page range or the page that has been error-corrected based on the received ECC related information.

In the fourth embodiment, in the case where the ECC related information obtained by combining the first embodiment to the third embodiment is stored in the ECC related information memory part 190, multiple read commands of the ECC related information corresponding to each combination may be prepared. For example, Table 1 shows the relationship between the read command of the ECC related information and the ECC related information based on the fourth embodiment. As shown in Table 1, the relationship between the multiple read commands of the ECC related information and the read contents of the ECC related information is defined. The controller 150 may refer to the table to read the ECC related information corresponding to the received read command. For example, in the case of a read command_C, the number of pages that have been error-corrected and the page addresses of the first page and the last page that have been error-corrected are output to the host apparatus.

TABLE 1

| Type of read command | Content of operation |
| --- | --- |
| Read command_A | Combination of first embodiment and second embodiment |
| Read command_B | Combination of first embodiment and third embodiment |
| Read command_C | Combination of second embodiment and third embodiment |
| Read command_D | Combination of first embodiment, second embodiment, and third embodiment |

Next, a fifth embodiment of the disclosure will be described. In the first embodiment to the fourth embodiment, commands are respectively used to read the ECC related information. In the embodiment, the selection of the ECC related information is preset. The setting is, for example, stored in a fuse memory together with the setting (for example, the voltage for programming, erasing, etc.) related to the operation of the NAND flash memory. The fuse memory is formed in the memory cell array. When the power is on, the content of the fuse memory is loaded to a configuration register, etc. The controller 150 controls various operations according to the content loaded to the configuration register.

An example of the setting method of ECC related information is shown in Table 2. Table 2 shows the relationship between the setting information and the ECC related information according to the fifth embodiment of the disclosure. As an example, the setting information includes 2 bits of data. "00" corresponds to the readout of the page addresses of all of the pages that have been error-corrected as in the first embodiment, "01" corresponds to the readout of the number of pages that have been error-corrected as in the second embodiment, "10" corresponds to the readout of the page addresses of the first page and the last page that have been error-corrected as in the third embodiment, and "11" corresponds to the readout of the combinations of the first embodiment to the third embodiment as in the fourth embodiment (for example, corresponds to the readout of the number of pages that have been error-corrected, and the page addresses of the first page and the last page that have been error-corrected).

TABLE 2

| Setting information | Content of setting |
| --- | --- |
| 00 | Operation of first embodiment |
| 01 | Operation of second embodiment |
| 10 | Operation of third embodiment |
| 11 | Operation of combination of first embodiment to third embodiment |

The controller 150 stores the ECC related information selected according to the setting information in the ECC related information memory part 190 when performing the continuous reading operation, and then outputs the ECC related information stored in the ECC related information memory part 190 when receiving the read command of the ECC related information.

In this way, according to the embodiment, the ECC related information selected using the setting information set by the user may be provided to the host apparatus in response to the read command of the ECC related information.

The embodiments of the disclosure have been described in detail above, but the disclosure is not limited to specific embodiments. Various modifications and changes may be made within the scope and the spirit of the disclosure described in the scope of the claims.

What is claimed is:

1. A semiconductor storage apparatus, comprising:
a NAND memory cell array;
a continuous reading component, continuously reading a predetermined number of pages of the NAND memory cell array in sequential in units of pages, the continuous reading component comprises a first latch and a second latch, the first latch and the second latch are connected in series and sequentially holds page data of each of the predetermined number of pages during continuous reading of the predetermined number of pages, wherein both of the first latch and the second latch include a first cache and a second cache, during continuous reading of the predetermined number of pages, the page data read from the NAND memory cell array is transmitted to the first latch, ½ page data read from the NAND memory cell array is held in the first cache of the first latch, the other ½ page data read from the NAND memory cell array is held in the second cache of the first latch, and the page data held in the first latch is transmitted to the first cache or the second cache of the second latch in units of ½ page, the ½ page data held in the first cache of the first latch is transmitted to the first cache of the second latch, the other ½ page data held in the second cache of the first latch is transmitted to the second cache of the second latch, during a period of outputting the page data held in the second latch to outside of the semiconductor storage apparatus, the page data of a next page is transmitted to the first latch;
an ECC circuit, coupled to the continuous reading component, performing ECC processing to the page data of each of the predetermined number of pages held in the first cache and the second cache of the second latch before the period of outputting the page data held in the second latch to outside of the semiconductor storage apparatus;
a memory component;
an output component; and
a controller, coupled to the continuous reading component, the ECC circuit, the memory component and the output component, monitoring a part of the pages whose page data has been error-corrected by the ECC circuit and storing ECC related information, only related to the part of the pages whose page data has been error-corrected by the ECC circuit, in the memory component during continuous reading of the predetermined number of pages,
wherein, the controller outputting the ECC related information, stored in the memory component, to a host apparatus through the output component in response to a read command after the continuous reading operation.

2. The semiconductor storage apparatus according to claim 1, wherein the ECC related information is page addresses of all of the pages that have been error-corrected by the ECC circuit.

3. The semiconductor storage apparatus according to claim 1, wherein the ECC related information is a number of pages that have been error-corrected by the ECC circuit.

4. The semiconductor storage apparatus according to claim 1, wherein the ECC related information is a page address of each of a first page and a last page that have been error-corrected by the ECC circuit.

5. The semiconductor storage apparatus according to claim 1, wherein
the ECC related information comprises at least one of first information of page addresses of all of the pages that have been error-corrected, second information of a number of pages that have been error-corrected, and third information of a page address of each of a first page and a last page that have been error-corrected.

6. The semiconductor storage apparatus according to claim 5, wherein a plurality of read commands corresponding to a combination of the first information, the second information, and the third information are prepared, and
the output component outputs the combination of the first information, the second information, and the third information respectively corresponding to the plurality of read commands.

7. The semiconductor storage apparatus according to claim 1, further comprising:
a setting component, setting a selection of the ECC related information, wherein
the output component outputs the ECC related information selected by the setting component in response to the read command after the continuous reading operation.

8. The semiconductor storage apparatus according to claim 7, wherein the ECC related information comprises at least one of first information as page addresses of all of the pages that have been error-corrected, second information as a number of pages that have been error-corrected, and third information of a page address of each of a first page and a last page that have been error-corrected, and the setting component sets the selection of any one of the first information, the second information, and the third information.

9. The semiconductor storage apparatus according to claim 7, wherein the setting component sets the selection of the ECC related information based on input setting information.

10. The semiconductor storage apparatus according to claim 8, wherein the setting component sets the selection of the ECC related information based on input setting information.

11. The semiconductor storage apparatus according to claim 1, wherein the memory component comprises a volatile random access memory region for reading and writing.

12. The semiconductor storage apparatus according to claim 1, wherein the read command after the continuous reading operation is input before other page read commands.

13. An ECC related information reading method, applicable to a NAND flash memory, comprising:
a reading step of continuously reading a predetermined number of pages of a NAND memory cell array in sequential in units of pages;
sequentially holding, by a first latch and a second latch which are connected in series, page data of each of the predetermined number of pages during continuous reading of the predetermined number of pages, wherein both of the first latch and the second latch include a first cache and a second cache, during continuous reading of the predetermined number of pages, the page data read from the NAND memory cell array is transmitted to the first latch, ½ page data read from the NAND memory cell array is held in the first cache of the first latch, the other ½ page data read from the NAND memory cell array is held in the second cache of the first latch, and the page data held in the first latch is transmitted to the first cache or the second cache of the second latch in units of ½ page, the ½ page data held in the first cache of the first latch is transmitted to the first cache of the second latch, the other ½ page data held in the second cache of the first latch is transmitted to the second cache of the second latch, during a period of outputting the page data held in the second latch to outside of the semiconductor storage apparatus, the page data of a next page is transmitted to the first latch;

performing, by an ECC circuit, ECC processing to the page data of each of the predetermined number of pages held in the first cache and the second cache of the second latch before the period of outputting the page data held in the second latch to outside of the semiconductor storage apparatus;

a monitoring and storing step of monitoring a part of the pages whose page data has been error-corrected by the ECC circuit and storing ECC related information, only related to the part of the pages whose page data has been error-corrected by the ECC circuit, in a memory component during continuous reading of the predetermined number of pages; and an outputting step of outputting the ECC related information, stored in the memory component, to a host apparatus in response to a read command after a continuous reading operation, wherein the ECC related information comprises at least one of page addresses of all of the pages that have been error-corrected, a number of pages that have been error-corrected, and a page address of each of a first page and a last page that have been error-corrected.

14. The ECC related information reading method according to claim 13, wherein the read command is to output at least one of the page addresses of all of the pages that have been error-corrected, the number of pages that have been error-corrected, and the page address of each of the first page and the last page that have been error-corrected.

15. The ECC related information reading method according to claim 13, further comprising a setting step of setting a selection of the ECC related information, wherein
the outputting step outputs the ECC related information selected in the setting step.

16. The ECC related information reading method according to claim 14, further comprising a setting step of setting a selection of the ECC related information, wherein
the outputting step outputs the ECC related information selected in the setting step.

17. The ECC related information reading method according to claim 13, wherein in a case of continuously reading pages spanning a plurality of blocks, the outputting step outputs the number of pages that have been error-corrected and the page address of each of the first page and the last page that have been error-corrected.

18. The ECC related information reading method according to claim 14, wherein in a case of continuously reading pages spanning a plurality of blocks, the outputting step outputs the number of pages that have been error-corrected and the page address of each of the first page and the last page that have been error-corrected.

19. The ECC related information reading method according to claim 13, wherein in a case of continuously reading pages within a single block, the outputting step outputs the page addresses of all of the pages that have been error-corrected.

20. The ECC related information reading method according to claim 14, wherein in a case of continuously reading pages within a single block, the outputting step outputs the page addresses of all of the pages that have been error-corrected.

* * * * *